(12) United States Patent
Feng et al.

(10) Patent No.: US 12,610,777 B2
(45) Date of Patent: Apr. 21, 2026

(54) SUBSTRATE PROCESSING APPARATUS

(71) Applicant: ACM RESEARCH (SHANGHAI), INC., Shanghai (CN)

(72) Inventors: Hao Feng, Shanghai (CN); Yuqi Wang, Shanghai (CN); Rong Xu, Shanghai (CN); Xiaoyan Zhang, Shanghai (CN); Hui Wang, Shanghai (CN)

(73) Assignee: ACM RESEARCH (SHANGHAI), INC., Shanghai (CN)

( * ) Notice: Subject to any disclaimer, the term of this patent is extended or adjusted under 35 U.S.C. 154(b) by 98 days.

(21) Appl. No.: 18/697,269

(22) PCT Filed: Aug. 26, 2022

(86) PCT No.: PCT/CN2022/115058
§ 371 (c)(1),
(2) Date: Mar. 29, 2024

(87) PCT Pub. No.: WO2023/051121
PCT Pub. Date: Apr. 6, 2023

(65) Prior Publication Data
US 2024/0404850 A1     Dec. 5, 2024

(30) Foreign Application Priority Data
Sep. 29, 2021   (CN) .......................... 202111155163.3

(51) Int. Cl.
*H01L 21/67*        (2006.01)
*H10P 72/00*        (2026.01)

(52) U.S. Cl.
CPC ...... *H10P 72/0604* (2026.01); *H10P 72/0414* (2026.01); *H10P 72/00* (2026.01); *H10P 72/0402* (2026.01)

(58) Field of Classification Search
CPC .. H10P 72/0414; H10P 72/0604; H10P 72/00; H10P 72/0402; H01L 21/67017;
(Continued)

(56) References Cited

U.S. PATENT DOCUMENTS 5,575,079 A * 11/1996 Yokomizo ......... H01L 21/67034
34/470
2010/0133355 A1* 6/2010 Park ........................ B05B 9/002
239/128
(Continued)

FOREIGN PATENT DOCUMENTS

| CN | 110114858 A | 8/2019 |
| CN | 210110719 U | 2/2020 |

(Continued)

OTHER PUBLICATIONS

International Search Report issued in International Application No. PCT/CN2022/115058 mailed on Nov. 9, 2022 (5 pages).
(Continued)

*Primary Examiner* — Benjamin L Osterhout
(74) *Attorney, Agent, or Firm* — Osha Bergman Watanabe & Burton LLP

(57) ABSTRACT

Disclosed in an embodiment of the present invention is a substrate processing apparatus, comprising a processing chamber, a liquid supply tank and a recovery tank. A first pipeline connects a first liquid inlet and a liquid outlet of the liquid supply tank. A second pipeline connects the first pipeline and a liquid inlet of the processing chamber. A third pipeline connects the first pipeline and a first liquid inlet of the recovery tank. A fourth pipeline connects a liquid outlet of the processing chamber and a second liquid inlet of the recovery tank. A fifth pipeline connects a liquid outlet of the recovery tank and a second liquid inlet of the liquid supply tank.

10 Claims, 2 Drawing Sheets

(58) Field of Classification Search
CPC ......... H01L 21/67051; H01L 21/67253; H01L
21/67
See application file for complete search history.

(56) References Cited

U.S. PATENT DOCUMENTS

| | | | |
|---|---|---|---|
| 2012/0227955 A1* | 9/2012 | Koshimizu | ....... H01L 21/67253 |
| | | | 165/281 |
| 2013/0206176 A1 | 8/2013 | Uchida et al. | |
| 2016/0284521 A1* | 9/2016 | Miyagawa | ........ H01J 37/32449 |
| 2017/0236703 A1* | 8/2017 | Higuchi | .............. B05B 12/1418 |
| | | | 134/18 |
| 2017/0323813 A1* | 11/2017 | Silveira | ............. H01L 21/67248 |
| 2019/0131144 A1* | 5/2019 | Iwahata | .................... B08B 3/14 |
| 2019/0371599 A1* | 12/2019 | Yoshida | ........... H01L 21/67017 |
| 2020/0384510 A1* | 12/2020 | Yoshida | .................... B08B 3/10 |
| 2021/0252560 A1* | 8/2021 | Kawaguchi | ....... H01L 21/67017 |
| 2021/0335596 A1* | 10/2021 | Hong | ................. H01L 21/2636 |

FOREIGN PATENT DOCUMENTS

| | | |
|---|---|---|
| CN | 112753094 A | 5/2021 |
| JP | 2014130940 A | 7/2014 |

OTHER PUBLICATIONS

Written Opinion issued in International Application No. PCT/CN2022/115058 mailed on Nov. 9, 2022 (7 pages).

* cited by examiner

SUBSTRATE PROCESSING APPARATUS

BACKGROUND OF THE INVENTION

1. Field of the Invention

The present invention generally relates to the field of semiconductor manufacturing technology, and more particularly relates to a substrate processing apparatus.

2. The Related Art

In the single-wafer cleaning apparatus, high-temperature chemical liquid is often used to clean the substrate. For some chemical liquids (such as ST250), their viscosity varies greatly with temperature. When the temperature is low, the viscosity of the chemical liquid may increase, and the particles in the chemical liquid may form agglomerates, which may make the substrate cleaning effect become poor. Based on the above reasons, when cleaning the substrate with high-temperature chemical liquid, it is necessary not only to ensure that the temperature of the chemical liquid supplied to the substrate is maintained at a preset temperature, but also to ensure that the chemical liquid has a little temperature fluctuation throughout the chemical liquid cycle, so as to achieve a better cleaning effect.

FIG. 1 illustrates a conventional substrate cleaning apparatus, including a liquid supply tank 200', a cleaning chamber 100' and a recovery tank 300'. The liquid supply tank 200' adjusts the temperature of the chemical liquid through its internal circulation pipeline L1' and provides the cleaning chamber 100' with a constant temperature chemical liquid. After the cleaning process is completed, the used chemical liquid will flow back to the recovery tank 300', and then flow back from the recovery tank 300' to the liquid supply tank 200' for recycling. However, both cleaning the substrate with the chemical liquid in the cleaning chamber 100' and temporarily storing the chemical liquid in the recovery tank 300' can lead the temperature of the chemical liquid to drop. The temperature drop not only causes particles to agglomerate in the chemical liquid, but also results in a large temperature difference between the chemical liquid in the recovery tank 300' and the liquid supply tank 200', sometimes up to 20° C., which may increase the difficulty of the temperature control of the liquid supply tank 200', make the temperature of the chemical liquid supplied to the cleaning chamber 100' lower than a preset cleaning temperature. All of these eventually lead to poor substrate cleaning effect, thereby affecting the product yield.

SUMMARY

One object of the present invention is to provide a substrate processing apparatus, which can effectively control the temperature of the chemical liquid and improve the product yield.

In order to achieve the above object, one embodiment of the present invention provides a substrate processing apparatus, comprising:

a processing chamber, having a liquid inlet and a liquid outlet;

a liquid supply tank, having a first liquid inlet, a second liquid inlet and a liquid outlet;

a recovery tank, having a first liquid inlet, a second liquid inlet and a liquid outlet;

a first pipeline, configured to connect the first liquid inlet and the liquid outlet of the liquid supply tank, so as to circulate the chemical liquid inside the liquid supply tank;

a second pipeline, configured to connect the first pipeline and the liquid inlet of the processing chamber, so as to transfer the chemical liquid in the liquid supply tank to the processing chamber;

a third pipeline, configured to connect the first pipeline and the first liquid inlet of the recovery tank, so as to transfer the chemical liquid in the liquid supply tank to the recovery tank;

a fourth pipeline, configured to connect the liquid outlet of the processing chamber and the second liquid inlet of the recovery tank, so as to return the used chemical liquid in the processing chamber to the recovery tank;

a fifth pipeline, configured to connect the liquid outlet of the recovery tank and the second liquid inlet of the liquid supply tank, so as to transfer the chemical liquid in the recovery tank back to the liquid supply tank;

wherein, the temperature of the chemical liquid transferred to the recovery tank through the third pipeline is higher than that of the chemical liquid transferred to the recovery tank through the fourth pipeline.

As an optional embodiment of the present invention, a first circulating pump, a first heater and a first temperature controller are sequentially arranged on the first pipeline;

the first circulating pump is configured to make the chemical liquid flow from the liquid supply tank back to the liquid supply tank through the first pipeline, so that the chemical liquid circulates inside the liquid supply tank;

the first heater is configured to heat the chemical liquid flowing through the first pipeline;

the first temperature controller is configured to detect the temperature of the chemical liquid and control the start/stop of the first heater, so as to maintain temperature of the chemical liquid in the liquid supply tank at a preset temperature.

As an optional embodiment of the present invention, the flow rate of the chemical liquid transferred to the recovery tank through the third pipeline is not less than the flow rate of the chemical liquid transferred to the recovery tank through the fourth pipeline.

As an optional embodiment of the present invention, further comprising a heating jacket disposed outside the fourth pipeline.

As an optional embodiment of the present invention, further comprising a second heater and a second temperature controller disposed in the recovery tank, the second temperature controller controlling the start/stop of the second heater to ensure that the temperature of the chemical liquid in the recovery tank does not exceed a preset temperature.

As an optional embodiment of the present invention, the liquid outlet of the recovery tank is located at the bottom of the recovery tank.

As an optional embodiment of the present invention, further comprising a liquid level controller disposed in the recovery tank, a second circulating pump disposed on the fifth pipeline, the liquid level controller controlling the start/stop of the second circulating pump to ensure that the liquid level in the recovery tank does not exceed a preset liquid level.

As an optional embodiment of the present invention, the liquid level controller is set with a first liquid level value and a second liquid level value, and when the liquid level controller detects that the liquid level in the recovery tank exceeds the first liquid level value, the liquid level controller sends a command to turn on the second circulating pump to pump the chemical liquid in the recovery tank back to the liquid supply tank;

when the liquid level controller detects that the liquid level in the recovery tank is lower than the second liquid level value, the liquid level controller sends a command to turn off the second circulating pump to stop pumping the chemical liquid in the recovery tank back to the liquid supply tank.

As an optional embodiment of the present invention, further comprising a temperature alarm disposed on the fifth pipeline, the temperature alarm being set with a safe temperature, when the temperature alarm detects that the temperature of the chemical liquid in the fifth pipeline exceeds the safe temperature, the temperature alarm sends out an alarm and the substrate processing apparatus stops operating.

As an optional embodiment of the present invention, the safety temperature is set with an upper limit value and a lower limit value, the upper limit value is the substrate processing temperature, the lower limit value is the critical temperature at which particle aggregation occurs in the chemical liquid, and when the temperature alarm detects that the temperature of the chemical liquid in the fifth pipeline is higher than the upper limit value or lower than the lower limit value, the temperature alarm sends out alarm to remind the substrate processing apparatus to stop operation.

In the present invention, part of the chemical liquid with higher temperature in the liquid supply tank flows back to the recovery tank to improve the overall temperature of the chemical liquid in the recovery tank, reduce the temperature fluctuation of the chemical liquid in the process of recycling, decrease the temperature difference between the chemical liquid in the recovery tank and the liquid supply tank, thereby improving the temperature control accuracy of the liquid supply tank, so as to keep the temperature of the chemical liquid supplied to the processing chamber constant, obtain a better cleaning effect, and improve the product yield.

DETAILED DESCRIPTION OF EMBODIMENTS

In order to explain the technical content, structural features, objects and effects of the present invention in detail, the following will be described in detail in combination with the embodiments and drawings.

Figure 1:
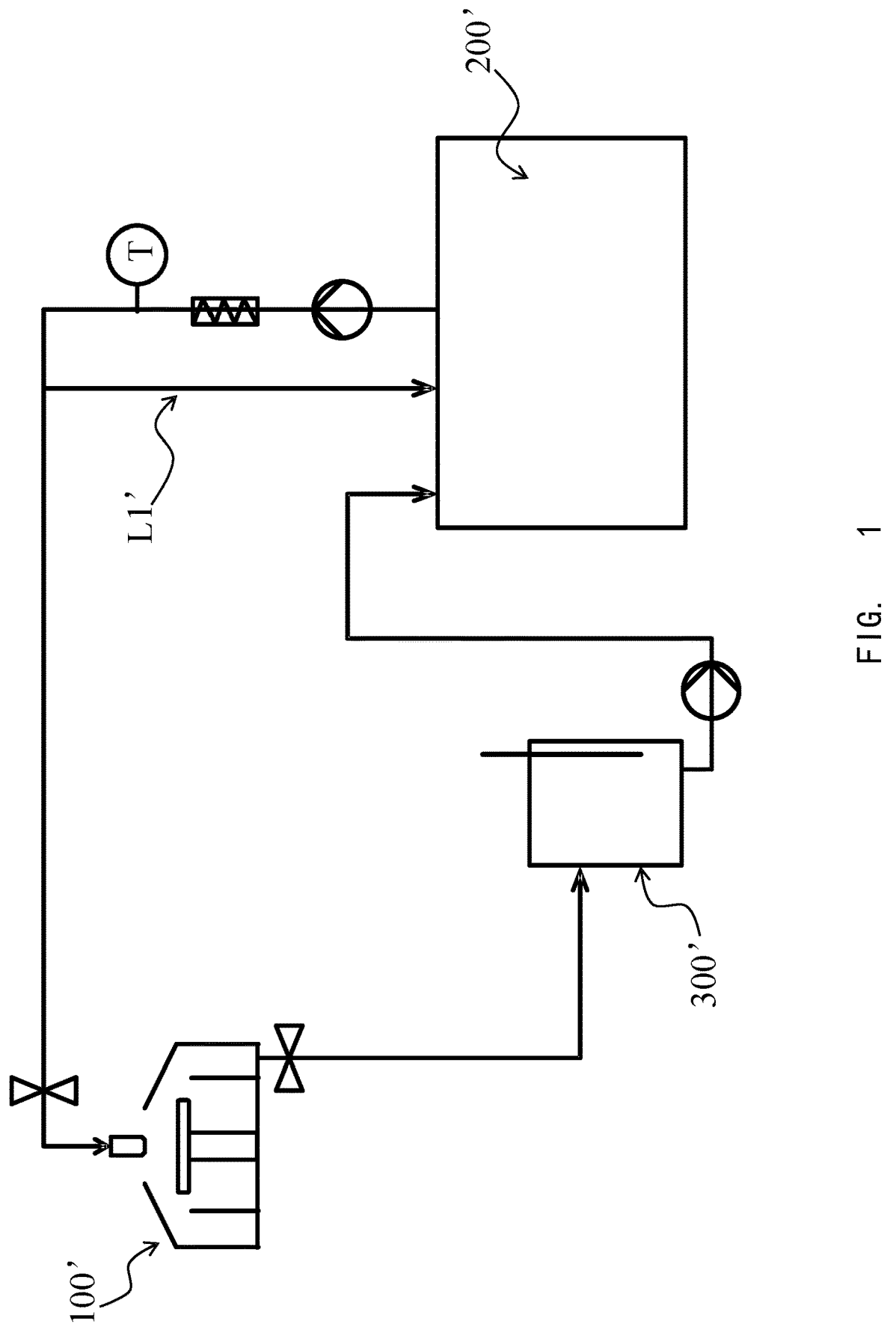
FIG. 1 illustrates a substrate cleaning apparatus in a prior art.
Figure 2:
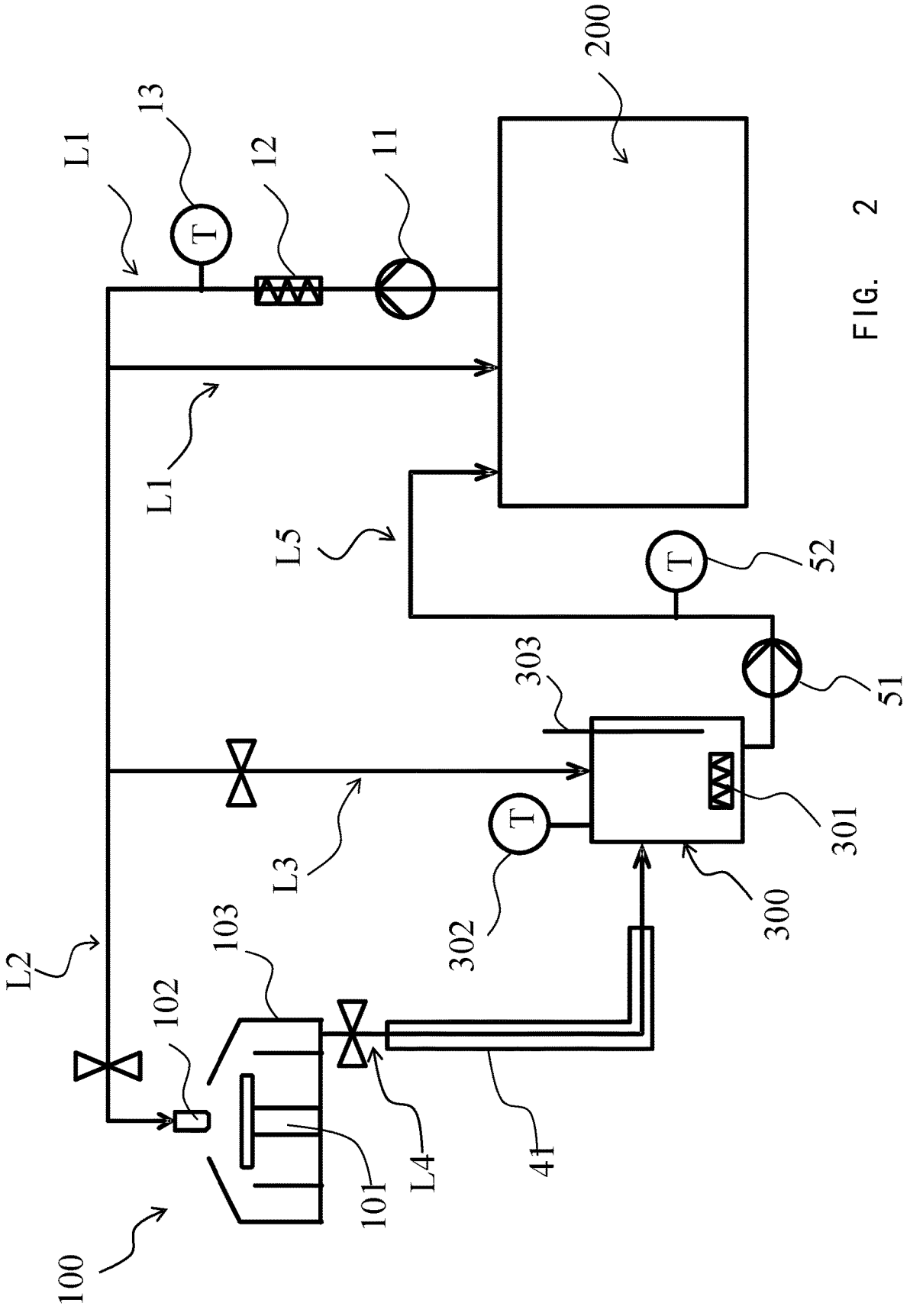
FIG. 2 illustrates a substrate processing apparatus according to an embodiment of the present invention.

Referring to FIG. 2, a substrate processing apparatus proposed by the present invention includes a processing chamber 100, a liquid supply tank 200 and a recovery tank 300. The processing chamber 100 has a liquid inlet and a liquid outlet, and is configured to perform liquid processing on a substrate. In a specific embodiment, the processing chamber 100 includes a spin chuck 101 for holding the substrate, a nozzle 102 for spraying the chemical liquid on the substrate surface, and a shroud 103 for preventing the chemical liquid from splashing and collecting the chemical liquid. The liquid inlet of the processing chamber 100 is connected to the nozzle 102, and the liquid outlet of the processing chamber 100 is located at the bottom of the processing chamber 100. In this embodiment, the processing chamber 100 is a single-wafer cleaning chamber.

The liquid supply tank 200 has a first liquid inlet, a second liquid inlet and a liquid outlet, and is configured to store the chemical liquid and supply the chemical liquid to the processing chamber 100. The first liquid inlet and the liquid outlet of the liquid supply tank 200 are connected by a first pipeline L1 to make the chemical liquid circulate inside the liquid supply tank 200. A first circulating pump 11, a first heater 12 and a first temperature controller 13 are sequentially arranged on the first pipeline L1 along the flow direction of the chemical liquid. The first circulating pump 11 is configured to make the chemical liquid flow from the liquid supply tank 200 back to the liquid supply tank 200 through the first pipeline L1, so that the chemical liquid circulates inside the liquid supply tank 200. The first heater 12 is configured to heat the chemical liquid flowing through the first pipeline L1. And the first temperature controller 13 is configured to detect the temperature of the chemical liquid and control the start/stop of the first heater 12 to ensure that the temperature of the chemical liquid in the liquid supply tank 200 is maintained at a preset temperature. In this embodiment, the chemical liquid in the liquid supply tank 200 is ST250 used for cleaning the substrate, and the process temperature of the chemical liquid is controlled at 40±0.1° C. The first temperature controller 13 sets the process temperature to 40° C. When the first temperature controller 13 detects that the temperature of the chemical liquid in the liquid supply tank 200 is lower than 40° C., the first temperature controller 13 will send a command to turn on the first heater 12 to circulate and heat the chemical liquid in the liquid supply tank 200. When the first temperature controller 13 detects that the temperature of the chemical liquid in the liquid supply tank 200 is higher than 40° C., the first temperature controller 13 will send a command to turn off the first heater 12 to stop circulating and heating the chemical liquid in the liquid supply tank 200.

The first pipeline L1 is connected to the liquid inlet of the processing chamber 100 through a second pipeline L2, so as to transfer the chemical liquid in the liquid supply tank 200 to the processing chamber 100, and the processing chamber 100 sprays the chemical liquid on the substrate through the nozzle 102 to process the substrate. In practical applications, multiple processing chambers 100 may be provided, correspondingly, multiple second pipelines L2 are drawn from the first pipeline L1, and each second pipeline L2 is connected to one processing chamber 100. After the chemical liquid supplied to the processing chamber 100 has processed the substrate, its temperature will drop, usually to room temperature at about 26° C.

The recovery tank 300 has a first liquid inlet, a second liquid inlet and a liquid outlet. The first pipeline L1 is connected to the first liquid inlet of the recovery tank 300 through a third pipeline L3 so as to transfer the chemical liquid in the liquid supply tank 200 to the recovery tank 300. The liquid outlet of the processing chamber 100 is connected to the second liquid inlet of the recovery tank 300 through a fourth pipeline L4 so as to return the used chemical liquid in the processing chamber 100 to the recovery tank 300. In this embodiment, the used chemical liquid in the processing chamber 100 can flow back to the recovery tank 300 through the fourth pipeline L4 by gravity. The recovery tank 300 simultaneously receives the chemical liquid from the liquid supply tank 200 and the chemical liquid from the processing chamber 100, wherein the temperature of the chemical liquid from the liquid supply tank 200 is higher than that of the chemical liquid from the processing chamber 100, and the two are mixed, which can increase the overall temperature of the chemical liquid in the recovery tank 300, thereby avoiding particle agglomeration caused by the temperature drop of the chemical liquid in the recovery tank 300.

Due to the configuration of the third pipeline L3, even when the processing chamber 100 stops working, the chemical liquid in the liquid supply tank 200 still flows through the recovery tank 300 via the third pipeline L3 back to the liquid supply tank 200, that is, regardless of whether the chemical liquid in the processing chamber 100 is flowed back to the recovery tank 300 through the fourth pipeline L4, the recovery tank 300 always participates in the circulation of the chemical liquid, so that the chemical liquid in the recovery tank 300 is not only always in a flowing state, but also has a temperature close to the temperature of the chemical liquid in the liquid supply tank 200.

In one embodiment, the flow rate of the chemical liquid transferred to the recovery tank 300 through the third pipeline L3 is not less than that of the chemical liquid transferred to the recovery tank 300 through the fourth pipeline L4, that is, the flow rate of hot chemical liquid back into the recovery tank 300 is greater than that of cold chemical liquid, thereby being able to more efficiently use the hot chemical fluid in the liquid supply tank 200 to heat the cold chemical fluid from the processing chamber 100.

In order to further improve the temperature of the chemical liquid collected in the recovery tank 300, a heating jacket 41 can be disposed outside the fourth pipeline L4 to partially compensate for the temperature loss of the chemical liquid when it flows back from the processing chamber 100 to the recovery tank 300, thereby improving the temperature of the chemical liquid when it enters the recovery tank 300 from the processing chamber 100. In this embodiment, the heating jacket 41 is set at 50° C. to 60° C.

In this embodiment, the recovery tank 300 is configured with a second heater 301, a second temperature controller 302 and a liquid level controller 303. The second temperature controller 302 makes the temperature of the chemical liquid in the recovery tank 300 not exceed a set temperature by controlling the start/stop of the second heater 301. In this embodiment, the second temperature controller 302 is set at 40° C.

The liquid outlet of the recovery tank 300 is located at the bottom of the recovery tank 300 and is connected to the liquid supply tank 200 through a fifth pipeline L5. By setting the liquid outlet of the recovery tank 300 at the bottom of the recovery tank 300, it is able to avoid the dead zone in the circulation and make the temperature of the chemical liquid in the recovery tank 300 be uniform. A second circulating pump 51 is disposed on the fifth pipeline L5. The liquid level controller 303 configured by the recovery tank 300 controls the start/stop of the second circulating pump 51 to ensure that the liquid level in the recovery tank 300 does not exceed a preset liquid level. Specifically, the liquid level controller 303 is set with a first liquid level value and a second liquid level value. When the liquid level in the recovery tank 300 exceeds the first liquid level value, the liquid level controller 300 will send a command to turn on the second circulating pump 51 to pump the chemical liquid in the recovery tank 300 back to the liquid supply tank 200. When the liquid level in the recovery tank 300 is lower than the second liquid level value, the liquid level controller 303 will send a command to turn off the second circulating pump 51 to stop pumping the chemical liquid in the recovery tank 300 back to the liquid supply tank 200, at this time the recovery tank 300 is in the process of collecting the chemical liquid.

In addition, a temperature alarm 52 is also disposed on the fifth pipeline L5, and the temperature alarm 52 is set with a safe temperature. When the temperature alarm 52 detects that the temperature of the chemical liquid in the fifth pipeline L5 exceeds the safe temperature, the temperature alarm 52 sends out an alarm and the substrate processing apparatus stops working. The safe temperature is set with an upper limit value and a lower limit value. The upper limit value is the substrate processing temperature, and the lower limit value is the critical temperature at which particle aggregation occurs in the chemical liquid. When the temperature alarm 52 detects that the temperature of the chemical liquid in the fifth pipeline L5 is higher than the upper limit value or lower than the lower limit value, the temperature alarm 52 sends out an alarm to remind the substrate processing apparatus to stop operation. In this embodiment, the safe temperature is 34° C.~40° C.

In the present invention, the recovery tank 300 receives not only the used chemical liquid from the processing chamber 100, but also the unused chemical liquid from the liquid supply tank 200. By mixing the two, the temperature of the chemical liquid in the recovery tank 300 can be improved and the temperature difference of the chemical liquid between the recovery tank 300 and the liquid supply tank 200 can be reduced. By installing a heating jacket outside the reflux pipeline of the processing chamber 100, the temperature loss of the chemical liquid can be reduced. By installing a heater in the recovery tank 300, the temperature of the chemical liquid in the recovery tank 300 can be further improved and the temperature fluctuation of the chemical liquid during the whole cycle can be reduced, which may make the temperature control of the liquid supply tank 200 be easier, enable the substrate processing apparatus to operate continuously and achieve a better cleaning effect.

As described above, the foregoing description of the present invention has been presented for purposes of illustration and description. It is not intended to be exhaustive or to limit the invention to the precise form disclosed, and obviously many modifications and variations are possible in light of the above teaching. Such modifications and variations that may be apparent to those skilled in the art are intended to be included within the scope of this invention as defined by the accompanying claims.

What is claimed is:

1. A substrate processing apparatus, comprising:
   a processing chamber, having a liquid inlet and a liquid outlet;
   a liquid supply tank, having a first liquid inlet, a second liquid inlet and a liquid outlet;
   a recovery tank, having a first liquid inlet, a second liquid inlet and a liquid outlet;
   a first pipeline, configured to connect the first liquid inlet and the liquid outlet of the liquid supply tank, so as to circulate chemical liquid inside the liquid supply tank;
   a second pipeline, configured to connect the first pipeline and the liquid inlet of the processing chamber, so as to transfer the chemical liquid in the liquid supply tank to the processing chamber;
   a third pipeline, configured to connect the first pipeline and the first liquid inlet of the recovery tank, so as to transfer the chemical liquid in the liquid supply tank to the recovery tank;
   a fourth pipeline, configured to connect the liquid outlet of the processing chamber and the second liquid inlet of the recovery tank, so as to return used chemical liquid in the processing chamber to the recovery tank;

a fifth pipeline, configured to connect the liquid outlet of the recovery tank and the second liquid inlet of the liquid supply tank, so as to transfer the chemical liquid in the recovery tank back to the liquid supply tank.

2. The substrate processing apparatus according to claim 1, further comprising a first circulating pump, a first heater and a first temperature controller, sequentially arranged on the first pipeline; wherein, the first circulating pump is configured to make the chemical liquid flow from the liquid supply tank back to the liquid supply tank through the first pipeline, so that the chemical liquid circulates inside the liquid supply tank;

the first heater is configured to heat the chemical liquid flowing through the first pipeline;

the first temperature controller is configured to detect the temperature of the chemical liquid and control the start/stop of the first heater, so that the temperature of the chemical liquid in the liquid supply tank is maintained at a preset temperature.

3. The substrate processing apparatus according to claim 1, wherein the flow rate of the chemical liquid transferred to the recovery tank through the third pipeline is not less than the flow rate of the chemical liquid transferred to the recovery tank through the fourth pipeline.

4. The substrate processing apparatus according to claim 1, further comprising a heating jacket disposed outside the fourth pipeline.

5. The substrate processing apparatus according to claim 1, further comprising a heater and a temperature controller disposed in the recovery tank, the temperature controller controlling the start/stop of the heater so that the temperature of the chemical liquid in the recovery tank does not exceed a preset temperature.

6. The substrate processing apparatus according to claim 1, wherein the liquid outlet of the recovery tank is located at the bottom of the recovery tank.

7. The substrate processing apparatus according to claim 1, further comprising a liquid level controller disposed in the recovery tank, a circulating pump disposed on the fifth pipeline, the liquid level controller controlling the start/stop of the circulating pump so that the liquid level in the recovery tank does not exceed a preset liquid level.

8. The substrate processing apparatus according to claim 7, wherein the liquid level controller is set with a first liquid level value and a second liquid level value, and when the liquid level controller detects that the liquid level in the recovery tank exceeds the first liquid level value, the liquid level controller sends a command to turn on the second circulating pump to pump the chemical liquid in the recovery tank back to the liquid supply tank;

when the liquid level controller detects that the liquid level in the recovery tank is lower than the second liquid level value, the liquid level controller sends a command to turn off the second circulating pump to stop pumping the chemical liquid in the recovery tank back to the liquid supply tank.

9. The substrate processing apparatus according to claim 1, further comprising a temperature alarm disposed on the fifth pipeline, the temperature alarm being set with a safe temperature, when the temperature alarm detects that the temperature of the chemical liquid in the fifth pipeline exceeds the safe temperature, the temperature alarm sends out an alarm, and the substrate processing apparatus stops operating.

10. The substrate processing apparatus according to claim 9, wherein a safety temperature is set with an upper limit value and a lower limit value, the upper limit value is the substrate processing temperature, the lower limit value is the critical temperature at which particle aggregation occurs in the chemical liquid, and when the temperature alarm detects that the temperature of the chemical liquid in the fifth pipeline is higher than the upper limit value or lower than the lower limit value, the temperature alarm sends out an alarm to remind the substrate processing apparatus to stop operation.

* * * * *